US012385965B2

(12) United States Patent
Arellano et al.

(10) Patent No.: US 12,385,965 B2
(45) Date of Patent: Aug. 12, 2025

(54) CONTINUOUS MONITOR DEVICE HAVING AN ENHANCED VISUAL ALARM

(71) Applicant: Desco Industries, Inc., Chino, CA (US)

(72) Inventors: Victor Arellano, Upland, CA (US); Arturo Murillo, Norco, CA (US); Alejandro Hernandez, Las Vegas, NV (US)

(73) Assignee: Desco Industries, Inc., Chino, CA (US)

( * ) Notice: Subject to any disclaimer, the term of this patent is extended or adjusted under 35 U.S.C. 154(b) by 69 days.

(21) Appl. No.: 18/511,842

(22) Filed: Nov. 16, 2023

(65) Prior Publication Data

US 2025/0164541 A1  May 22, 2025

(51) Int. Cl.
*G01R 31/50* (2020.01)
*A41D 13/008* (2006.01)
*G01R 31/12* (2020.01)
*G01R 31/14* (2006.01)
*G08B 5/36* (2006.01)

(52) U.S. Cl.
CPC ......... *G01R 31/1272* (2013.01); *G01R 31/14* (2013.01); *G08B 5/36* (2013.01)

(58) Field of Classification Search
None
See application file for complete search history.

(56) References Cited

U.S. PATENT DOCUMENTS

| | | | | | |
|---|---|---|---|---|---|
| 4,558,309 | A | * | 12/1985 | Antonevich | A61B 5/276 340/649 |
| 4,745,519 | A | * | 5/1988 | Breidegam | A61N 1/14 361/220 |
| 5,057,965 | A | * | 10/1991 | Wilson | G01R 31/54 324/705 |
| 5,519,384 | A | * | 5/1996 | Chanudet | G01R 31/52 340/649 |
| 5,768,086 | A | * | 6/1998 | Abe | H05F 3/00 361/220 |
| 6,035,260 | A | * | 3/2000 | Pohribnij | A61N 1/14 361/220 |
| 6,930,612 | B1 | * | 8/2005 | Kraz | G08B 21/185 340/657 |

(Continued)

FOREIGN PATENT DOCUMENTS

| | | |
|---|---|---|
| CA | 2017630 C | 1/1991 |
| CN | 2728534 Y | 9/2005 |

(Continued)

OTHER PUBLICATIONS

Hughes Sales Site (Year: 2025).*

(Continued)

*Primary Examiner* — Curtis A Kuntz
*Assistant Examiner* — Jerold B Murphy
(74) *Attorney, Agent, or Firm* — Berkeley Law & Technology Group, LLP

(57) ABSTRACT

A continuous monitor having an enhanced visual alarm including a printed circuit board, one or more sensors, one or more light emitting devices and a translucent housing is disclosed. The printed circuit board and the one or more light emitting devices may be disposed within the translucent housing. In one aspect, a light signal may visibly illuminate the translucent housing providing a visual alarm for an observer.

20 Claims, 15 Drawing Sheets

(56) References Cited

U.S. PATENT DOCUMENTS

| | | | |
|---|---|---|---|
| 7,539,002 B1 | 5/2009 | Kraz et al. | |
| 7,817,057 B2 * | 10/2010 | Bumanlag | G08B 21/0297 361/212 |
| 8,963,522 B2 | 2/2015 | Otsuka et al. | |
| 9,291,661 B2 * | 3/2016 | Liu | G01R 31/54 |
| 9,983,251 B2 | 5/2018 | Savich | |
| 2007/0174011 A1 * | 7/2007 | Enta | H01L 22/14 257/E21.531 |
| 2022/0167490 A1 | 5/2022 | Berg et al. | |

FOREIGN PATENT DOCUMENTS

| | | | | |
|---|---|---|---|---|
| CN | 201352242 Y | * | 11/2009 | |
| CN | 108720808 A | * | 11/2018 | A61B 5/00 |
| CN | 112881838 A | | 6/2021 | |
| CN | 218601916 U | * | 3/2023 | |
| DE | 202007016070 U1 | * | 3/2008 | G08B 17/10 |
| EP | 407186 A | * | 1/1991 | |
| EP | 2826520 B1 | | 3/2019 | |
| JP | 2022011878 A | * | 1/2022 | |
| JP | 2022058788 A | * | 4/2022 | G03F 1/42 |
| WO | 9909792 | | 2/1999 | |
| WO | 2022103550 A2 | | 5/2022 | |
| WO | WO-2023245198 A2 | * | 12/2023 | G01R 29/0814 |

OTHER PUBLICATIONS

Device Sales Brochure (Year: 2025).*
CN-108720808-A English Language Translation (Year: 2018).*
CN-201352242-Y English Language Translation (Year: 2009).*
CN-218601916-U English Language Translation (Year: 2023).*
Desco Technical Bulletin TB-3072, "Mini Monitor Installation, Operation and Maintenance," Desco.com, Feb. 2023, 6 pages.
Combined Search and Examination Report under Sections 17 and 18(3), Mailed May 22, 2025, 13 pages.

* cited by examiner

CONTINUOUS MONITOR DEVICE HAVING AN ENHANCED VISUAL ALARM

BACKGROUND

1. Field

This application relates to continuous monitor devices, and more particularly to a continuous monitor device with an enhanced visual alarm.

2. Information

Continuous monitors are used to monitor the path-to-ground integrity of an operator and worksurface to limit the risk of an ESD (electrostatic discharge) event from occurring. The monitor is plugged into both the operator's electrostatic discharge (ESD) wrist strap and the workbench or mat and monitors the path-to-ground integrity of the operator, the ESD worksurface, and the electrical ground used by the monitor. When the operator is wearing the ESD wrist strap, the monitor observes the resistance of the loop, consisting of a wire, a person, a wristband, and a second wire. If any part of the loop should open (i.e., become disconnected or have out of limit resistance), the monitor will go into an alarm state.

If an event (e.g., detection of an intermittent or failure of the path-to-ground of the operator wearing a wrist strap) occurs on or near sensitive electronic parts like microchips, there is a chance they will end up damaged. This damage could be immediately noticeable (for example, in the form of a malfunction or failure), but it could also lead to a latent defect, which could affect the product at any point in its lifespan. Hence, a constant monitor may be beneficial when ESD suspectable products are being handled that are of such value that knowledge of a failure must be instant.

Thus, there is a need to provide an instant and impactful notification to an operator of an event that may cause damage to electronic parts.

BRIEF DESCRIPTION OF THE DRAWINGS

Other aspects, features and advantages will become more fully apparent from the following detailed description, the appended claims, and the accompanying drawings, provided solely for purposes of illustration without restricting the scope of any embodiment:

Figure 1:
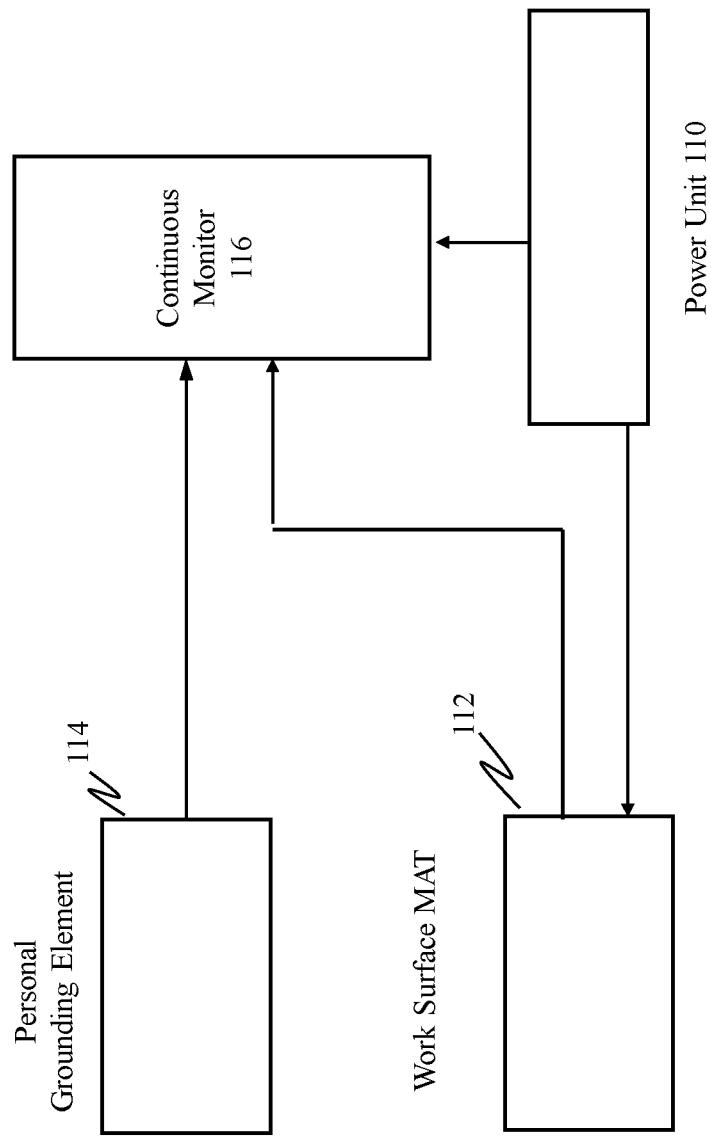
FIG. 1 is a schematic diagram of an architecture in which techniques and structures for providing the continuous monitor disclosed herein may be implemented.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Furthermore, structural and/or other changes may be made without departing from claimed subject matter. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents. Further, it is to be understood that other embodiments may be utilized. Also, embodiments have been provided of claimed subject matter and it is noted that, as such, those illustrative embodiments are inventive and/or unconventional; however, claimed subject matter is not limited to embodiments provided primarily for illustrative purposes. Thus, while advantages have been described in connection with illustrative embodiments, claimed subject matter is inventive and/or unconventional for additional reasons not expressly mentioned in connection with those embodiments. In addition, references throughout this specification to "claimed subject matter" refer to subject matter intended to be covered by one or more claims, and are not necessarily intended to refer to a complete claim set, to a particular combination of claim sets (e.g., method claims, apparatus claims, etc.), or to a particular claim.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the patent application, particular context of description and/or usage provides helpful guidance regarding reasonable inferences to be drawn; however, likewise, "in this context" in general without further qualification refers to the context of the present patent application.

Exemplary embodiments of the present disclosure describe a continuous monitor having an enhanced visual alarm. Turning to FIG. 1, an illustrative system architecture for operating the continuous monitor device having an enhanced visual alarm is shown. The system 100 includes a power unit 110, a work surface mat 112 (e.g., a grounding ESD mat), a personal grounding element 114 (e.g., an ESD wrist strap), and the continuous monitor device having an enhanced visual alarm ("the device") 116. The terms "the device" and "continuous monitor" have been used interchangeably throughout the disclosure and/or Figures. In some embodiments, the device may include an ESD continuous monitor.

Power unit 110 may provide power to work surface mat 112 and device 116. Power unit 110 may also include a power supply 111 (e.g., a 9V power supply) and a voltage regulator and noise filter 113 (e.g., a 5V voltage regulator and noise filter).

Work surface mat 112 may aid in preventing electrostatic discharge ("ESD") sensitive items and assemblies from being damaged by electrostatic discharge by providing a low charge (antistatic) worksurface area that will limit static electricity to be generated below potentially damaging levels. Moreover, work surface mat 112 may remove an electrostatic charge from conductive objects placed on the worksurface by transferring static electricity from the work surface to ground. Work surface mat 112 may include a dissipative top surface and a conductive inner and/or bottom surface depending on whether the surface mat is a 2-layer or 3-layer mat.

In order to effectively provide a work surface that has essentially no charge and/or removes charges from all conductors that are placed on the work surface, the work surface may be properly grounded. A properly grounded work surface may maintain a resistance to ground value within a certain range. In some embodiments, work surface mat 112 may maintain a resistance to ground value which is less than or equal to 500 megohms and greater than or equal to 100 megohms, for example.

Figure 4A:
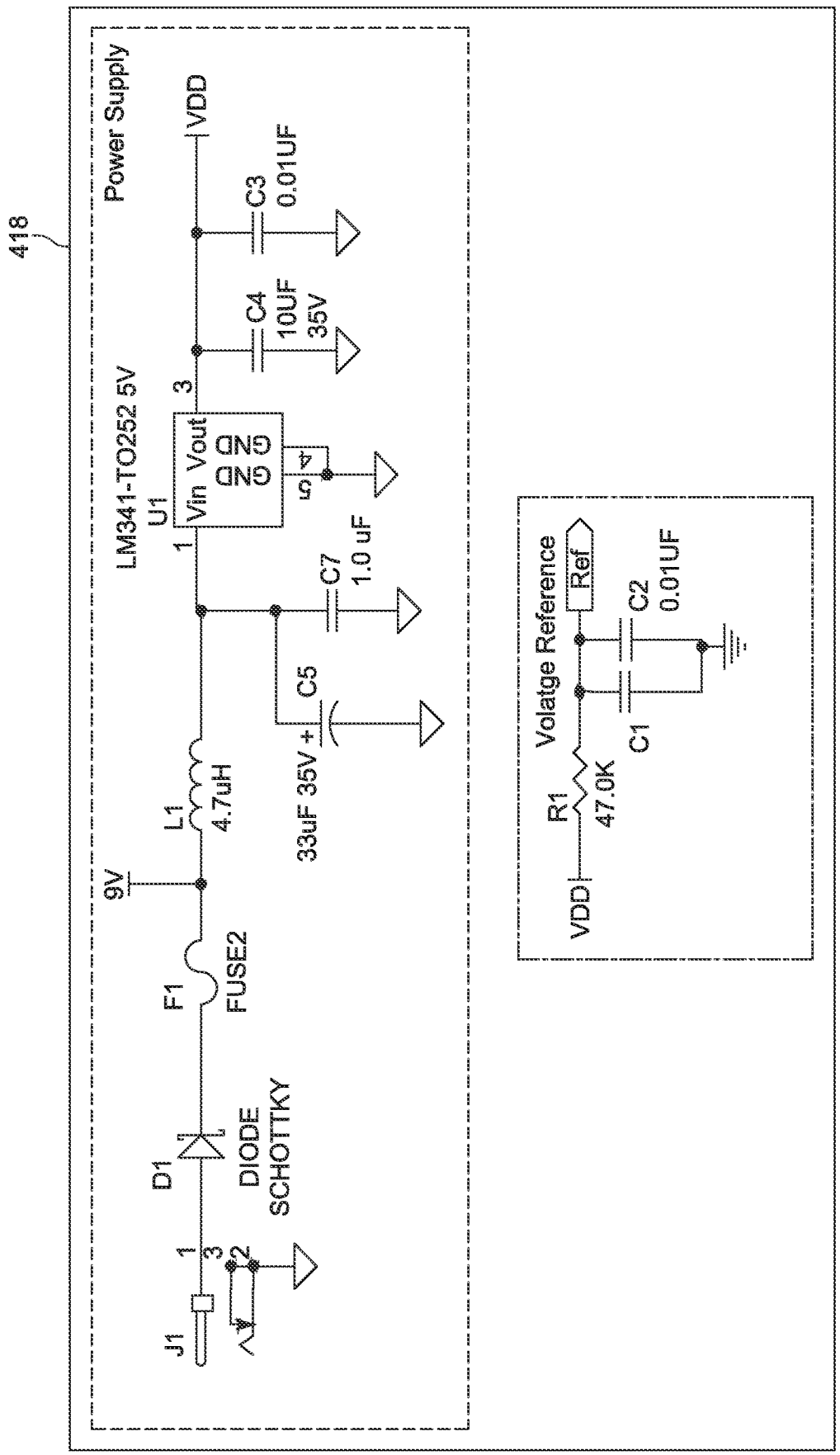
FIG. 4A is an exemplary electric circuit diagram of a power unit interface according to an embodiment.
Figure 4B:
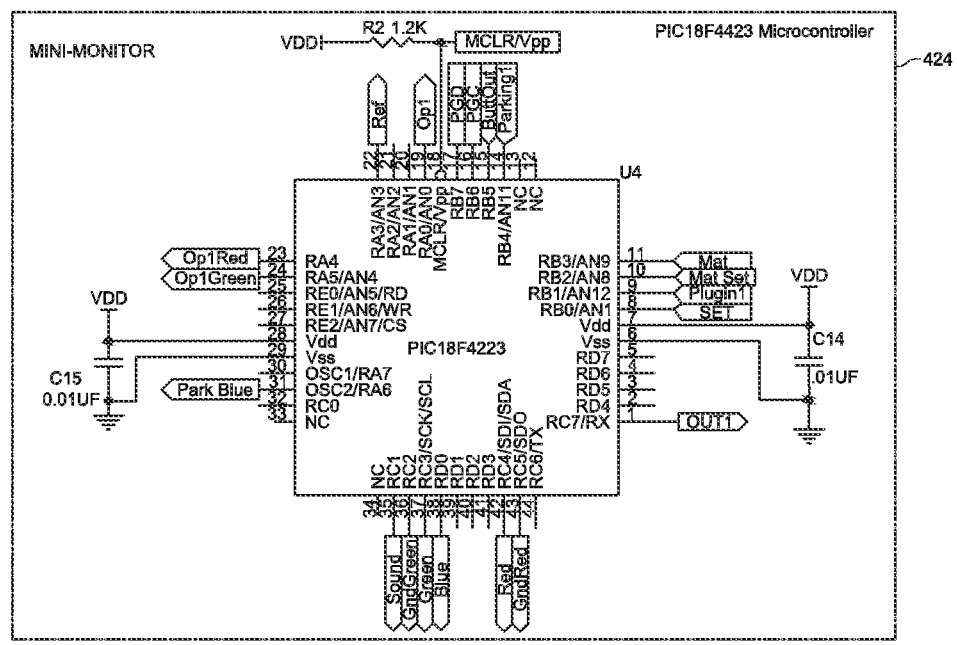
FIG. 4B is an exemplary programmable integrated circuit diagram of a microcontroller according to an embodiment.
Figure 4C:
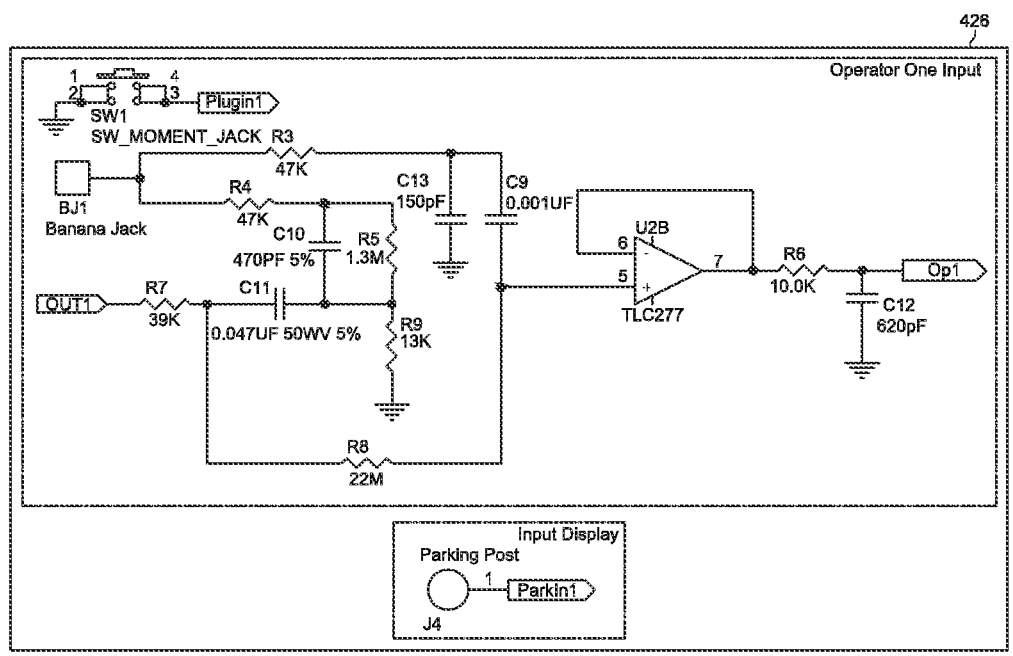
FIG. 4C is an exemplary electric circuit diagram of a personal grounding element sensor according to an embodiment.
Figure 4D:
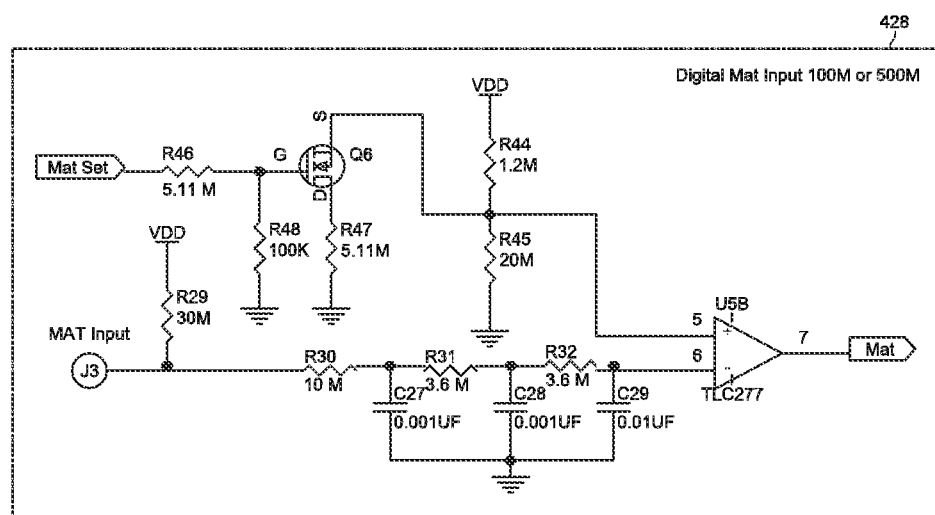
FIG. 4D is an exemplary electric circuit diagram of a work surface mat sensor according to an embodiment.
Figure 4E:
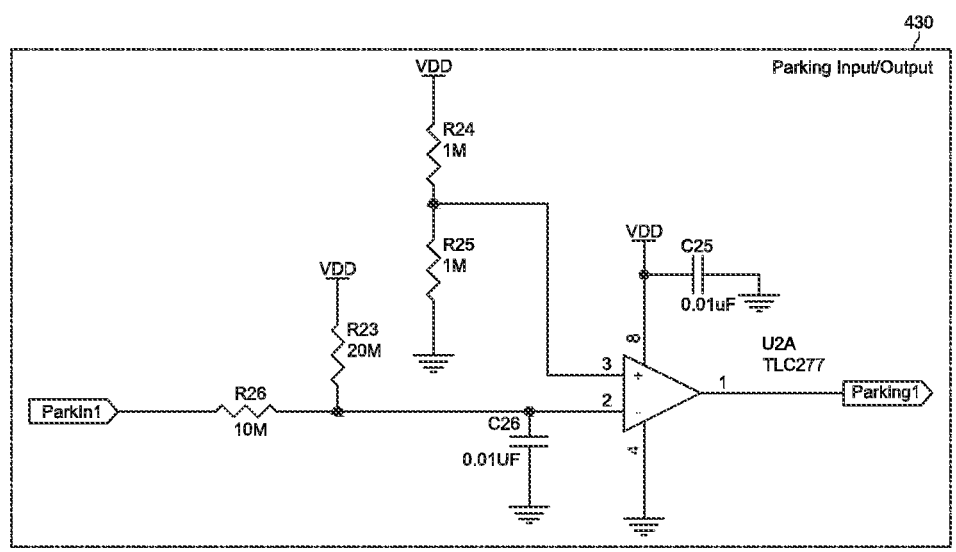
FIG. 4E is an exemplary electric circuit diagram of a park sensor according to an embodiment.
Figure 4F:
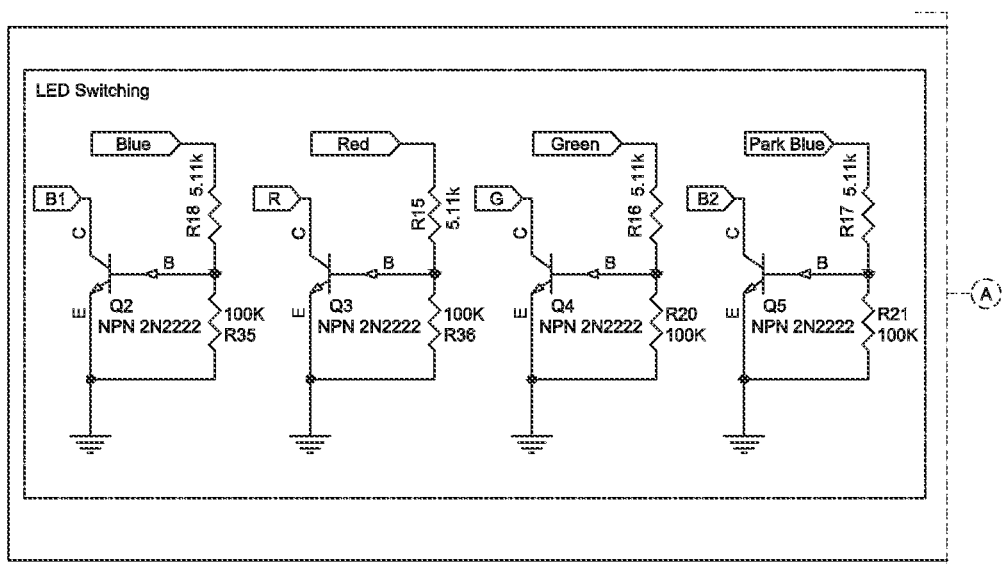
FIG. 4F is an exemplary electric circuit diagram of a plurality of light emitting devices according to an embodiment.
Figure 4F:
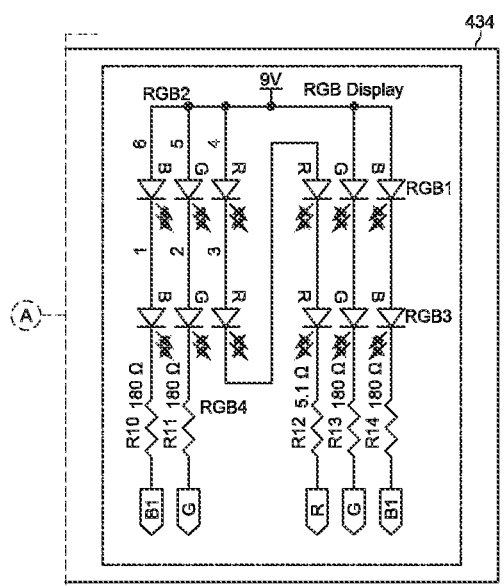
Figure 4G:
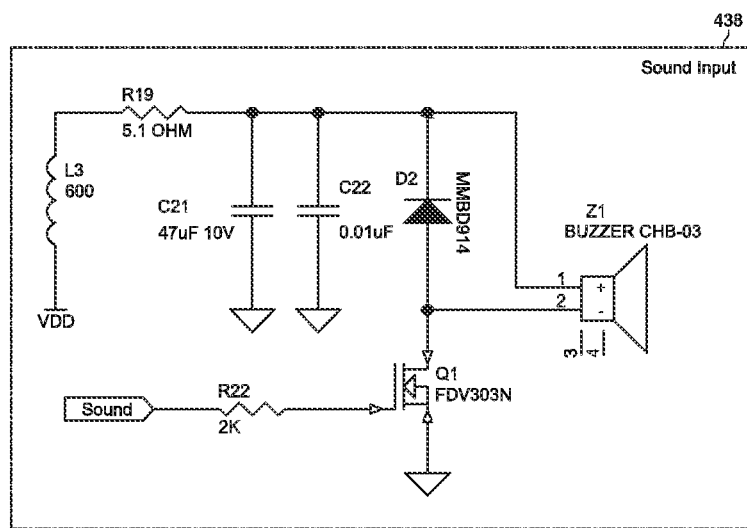
FIG. 4G is an exemplary electric circuit diagram of a sound section according to an embodiment.
Figure 4H:
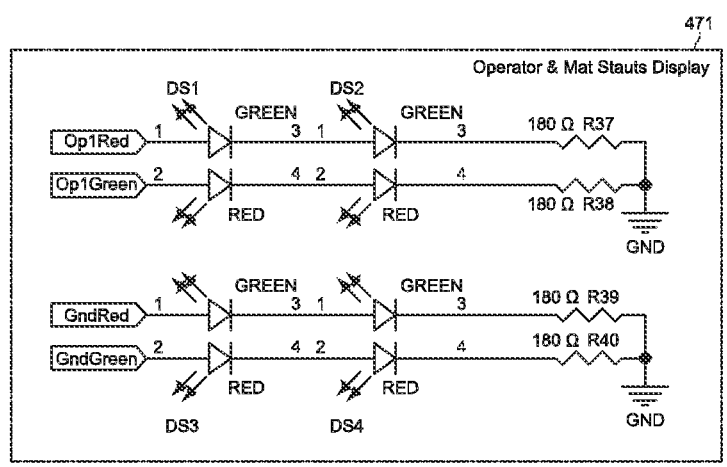
FIG. 4H is an exemplary electric diagram of a ground point according to an embodiment.
Figure 4I:
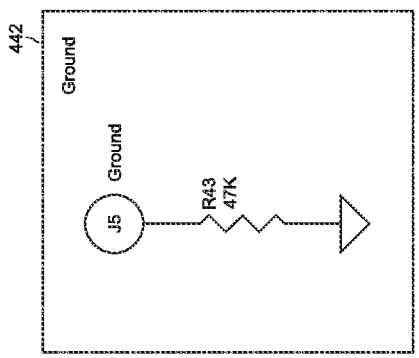
FIG. 4I is an exemplary electric circuit diagram of a work surface mat status display according to an embodiment.

Work surface mat 112 may connect to device 116 at work surface mat interface 120, and in some embodiments, device 116 may be configured to directly attach (i.e., bond) to work surface mat 112 without using a wire. Device 116 may bond (i.e., establish an electrical connection) to work surface mat 112 using one or more fasteners. So, for example, turning to FIGS. 2A and 2B, device 116 may include threaded fasteners 225 which are conductively mounted to printed circuit board 221. The threaded fasteners are adapted to receive screws (e.g., screws 227) to fasten device 116 to work surface mat 112 to form a conductive connection between the work surface mat and the printed circuit board. In the particular implementation of printed circuit board 221 according to FIGS. 4A through 4H, for example, a first threaded fastener 225 may be connected to node J3 (FIG. 4D) to receive a first screw 227 while a second threaded fastener 225 may be connected to a ground node to receive a second screw 227.

The personal grounding element 114 connects to both device 116 and an operator and is used to connect the operator to ground. The personal grounding element connects to device 116 at personal grounding element interface 122. In some embodiments, the personal grounding element is a wrist strap including a wristband and a strap cord (e.g., and ESD coil cord). The operator wears the wristband and connects to device 116 with the strap cord. The wrist strap is conductive which provides an electrical connection to the skin of the operator. Further, the wrist strap has a one megohm current limiting resistor at the cuff end of the wrist strap cord. The wrist strap does not prevent generation of charges (e.g., an electrostatic discharge), instead its purpose is to protect against these charges by dissipating these charges to ground as quickly as possible.

Personal grounding element 114 may connect to device 116 using a first connector element, such as, for example, a banana plug which fits into a banana jack. In some embodiments, the personal grounding element may also connect to device 116 using a second connector element, such as, for example, a snap fitting which connects to a snap plug. A strap cord of the wrist strap may include the first connector element at a distal end that connects to device 116 at a personal grounding element interface, described further below, and includes a second connector element at a proximate end that connects to device 116 at a park interface 140, described further below.

In some embodiments, device 116 may operate as a ground point for work surface mat 112 and the personal grounding element 114. In this instance, the work surface mat 112 connects to ground point 142 at device 116 and personal grounding element 114 may connect to ground point 142 at device 116. Ground point 142 may be configured as electric circuit 442 shown in FIG. 4D and connect to earth ground.

Figure 2A:
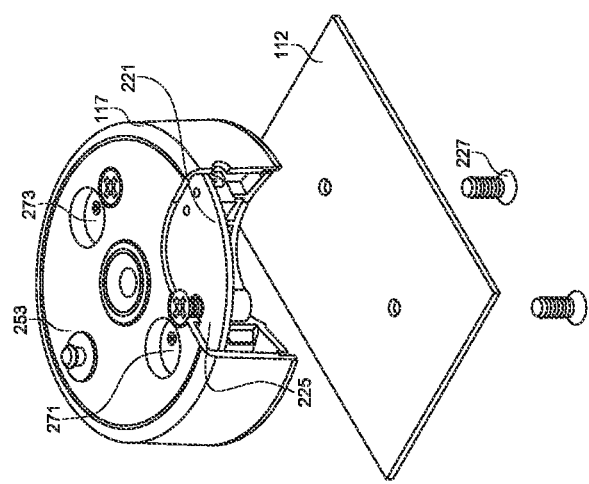
FIG. 2A is a top perspective view of the continuous monitor according to an embodiment.
Figure 2B:
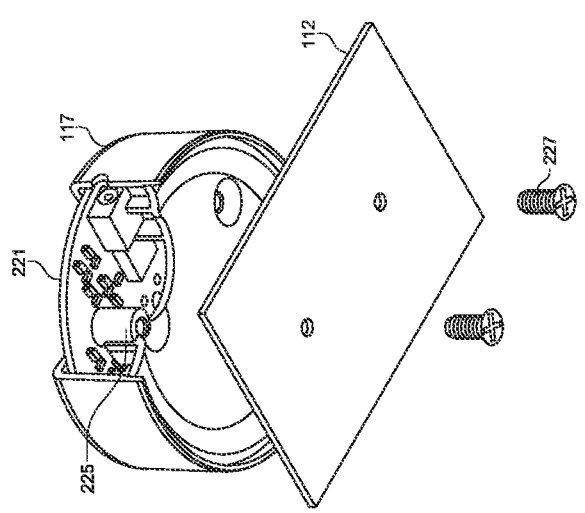
FIG. 2B is a rear perspective view of the continuous monitor according to according to an embodiment.
Figure 3:
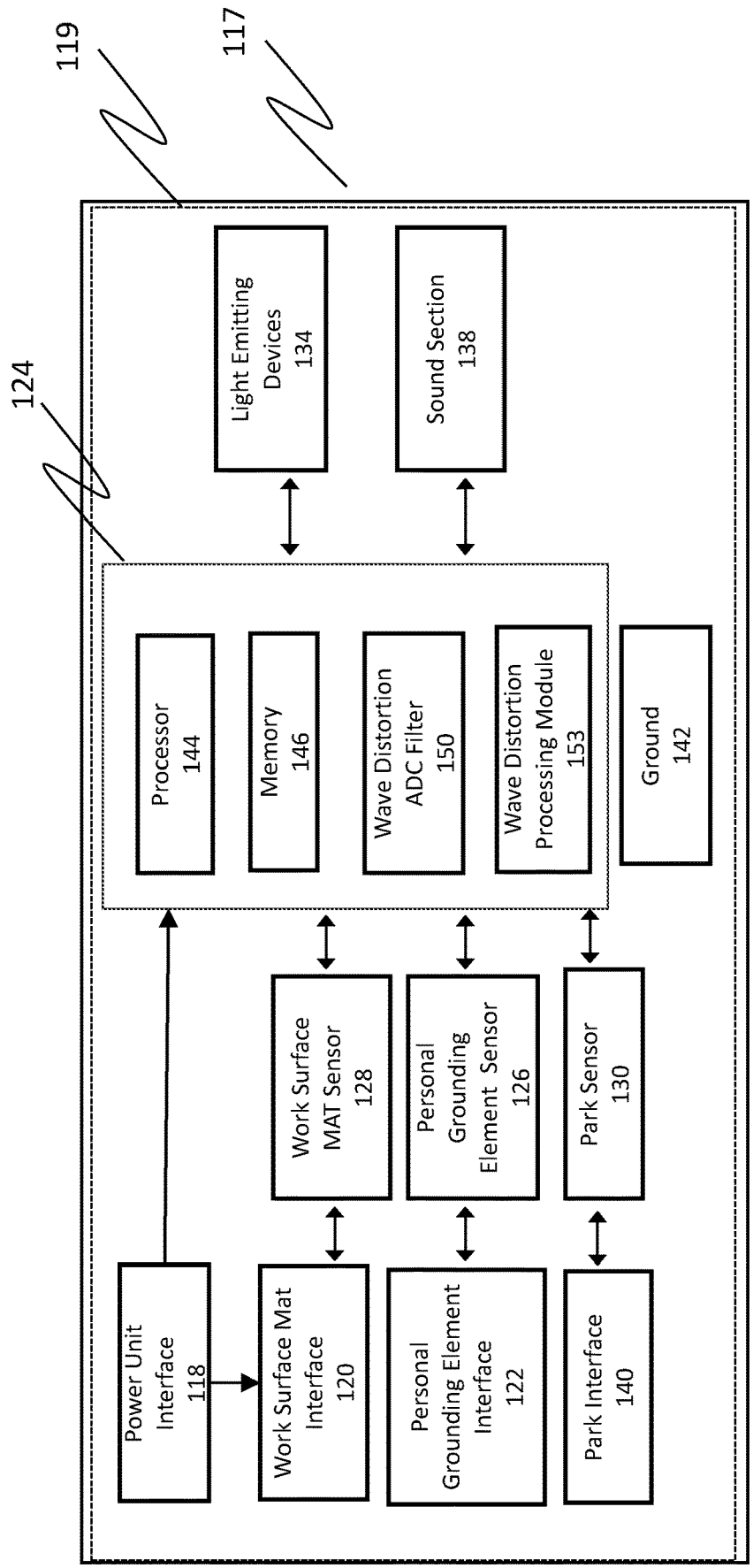
FIG. 3 is a schematic diagram of a continuous monitor according to an embodiment.

Turning to FIG. 3, device 116 may include an enclosure 117 (e.g., translucent housing) which houses a power unit interface 118, a light diffuser 119, a work surface mat interface 120, a personal grounding element interface 122, microcontroller (i.e., signal control circuit) 124, a personal grounding element sensor 126, a work surface mat sensor 128, a parking sensor 130, RGB LEDs (i.e., light emitting devices) 134, push, a sound section 138, a park interface 140, and a ground point 142, which are collectively elements housed in the enclosure. In some embodiments, all or some of the elements housed in the enclosure are integrated on a printed circuit board 221, referring to FIGS. 2A-2B. In some embodiments, the light diffuser 119 may be integrated in the construction material of the enclosure. While the particular implementation of FIG. 3 shows a microprocessor 124 to process sensor signals and provide signals to output devices, it should be understood that microprocessor 124 is merely an example of a signal control circuit that may be used for this purpose. For example, a signal control circuit implemented with a field programmable gate array (FPGA), an analog circuit and/or application specific integrated circuit (ASIC) may be used without deviating from claimed subject matter.

Enclosure 117 may be configured to operate in a dual manner as a housing unit and a visual alarm. Enclosure 117 may have a size and shape form factor suitable to fit all of the elements therein and to provide an attention grabbing visual alarm. Enclosure 117 may be constructed from a translucent substance including a light diffusing material (i.e., light diffuser 119), such as, for example, a semitransparent polycarbonate material, which will evenly diffuse the light emitted by the RGB LEDs. In one embodiment, the enclosure has a circular shape which causes a circular angle light diffuser effect, spreading the light emitted by the RGB LEDs into a circular pattern. This circular angle light diffuser effect may illuminate an entire enclosure 117 providing a high visibility visual alarm.

In some embodiments, the enclosure has a compact form factor. Although, enclosure 117 is shown and described as having a circular shape and a compact form factor, enclosure 117 may be configured in any other suitable shape and size form factor, and claimed subject matter is not limited in this respect.

Power unit interface 118 (e.g., power inlet) may receive power from power unit 110 and convert received power to a form suitable (e.g., converts AC to DC) for elements housed in enclosure 117. Power unit interface 118 may be configured as electric circuit 418 shown in FIG. 4A, for example. Work surface mat interface 120 may include a connection terminal (e.g., "J3" shown in electric circuit 428 in FIG. 4B) where the work surface mat 112 connects to device 116 and is a monitored connection point (by device 116). Work surface mat interface 120 may connect to work surface mat sensor 128 which senses a resistance level of work surface mat 112. Work surface mat sensor 128 may be configured as electric circuit 428 shown in FIG. 4B. Moreover, the work surface mat interface 120 may be integrated within microcontroller 124 or disposed on a printed circuit board housed in enclosure 117.

Personal grounding element interface 122 may include a banana jack (e.g., "BJ1" shown in electric circuit 426 in FIG. 4B) where a wrist strap cord connects to device 116 (via the first connector element) and is a monitored connection point (by device 116). Personal grounding element interface 112 may connect to personal grounding element sensor 126 which senses an output signal from personal grounding element 114 and sends the signal to microcontroller 124 for wave distortion processing. Personal grounding element sensor 126 may be configured as electric circuit 426 shown in FIG. 4B, for example. Personal grounding element sensor 126 may be integrated within microcontroller 124 or disposed on a printed circuit board housed in enclosure 117, for example.

Park interface 140 may include a connection terminal (e.g., "J4" shown in electric circuit 430 in FIG. 4C) where a wrist strap cord also connects to device 116 (via the second connector element) and is a monitored connection point (e.g., monitored by device 116). Park interface 120 may connect to park sensor 130 which may sense a connection of a wrist strap cord to the connection terminal or a touch input from an operator. In a particular implementation, park sensor 130 may include a touch input sensor and may be configured as electric circuit 430 shown in FIG. 4C, for example. Park sensor 130 may be integrated within microcontroller 124 or disposed on a printed circuit board housed within enclosure 117, for example.

Park interface 140 may allow an operator to disconnect and park a personal grounding element (e.g., a wrist strap) when leaving a workstation without creating a false alarm. If the operator touches park interface 140, the device's alarms (visual and audible) may be disabled for a predetermined amount of time, which may allow the operator to disconnect from the wrist strap and park it.

Microcontroller 124 may control operation of device 116 and include one or more processors (processor cores), at least one non-transitory memory including instructions that are executed by the one or more processors to effectuate operations performed by device 116, a wave distortion ADC filter 150 and a wave distortion processing module 153. Wave distortion processing module 153 may be implemented as processor executable instructions and may include routines, programs, objects, components, logic, data structures, and so on that perform particular tasks or implement particular abstract data types. Moreover, microcontroller 124 may include one or more input/output connections and one or more programmable input/output peripherals. Microcontroller 124 may be configured as programmable integrated circuit 424 shown in FIG. 4A, for example.

Microcontroller 124 may be configured to detect an event that may cause microcontroller 124 to activate one or more alarms, which may include an audible alarm, visual alarm, or any other suitable type of alarm. In some embodiments, enclosure 117 may act as a display for a visual alarm using one or more light emitting devices (i.e., RGB LEDs 134) and sound section 138 provides an audible alarm. An event causing microcontroller 124 to activate an alarm may comprise an operating condition that the device notifies an operator about when it is detected. Such an event may include, for example, detection of i) an operator is properly grounded, ii) an operator is not properly grounded, iii) a personal grounding element is parked, iv) a work surface mat is not properly grounded, v) a work surface mat is properly grounded, etc. Although the present disclosure describes the aforementioned specific events, the microcontroller can be programmed to detect other events without deviating from claimed subject matter.

Microcontroller 124 may detect an event using various processes. In particular, microcontroller 124 may employ wave distortion processing to detect an operator event (i.e., while an operator wearing a personal grounding element is/is not connected to ground properly). Wave distortion (i.e., vector impedance) processing may provide continuous monitoring of a ground path integrity of an operator wearing a personal grounding element 114. The process works by applying a continuous test voltage (e.g., 1.2 volts peak-to-peak at 1 to 2 microamperes) to the personal grounding element 114 that is connected to the device 116. Such a test voltage may create a square wave that the microcontroller 124 compares to established patterns. Microcontroller 124 may measure an impedance at the personal grounding element interface 122 (i.e., banana jack) and monitor for changes in either a capacitance or resistance of a circuit which includes the wrist strap and its wearer. For example, microcontroller 124 may apply filtering and time domain sampling to filter out false signals caused by voltage offsets and other electro-magnetic and electrostatic interference. Microcontroller 124 may compute a phase difference between a signal current and voltage to detect changes in impedance of the cord, wristband, and operator. According to an embodiment wave distortion processing module 153 may be adaptable to process signals to detect events from a wristband and coiled cord according to any one of several different designs, and application of wave distortion processing module 153 is not limited to any particular wristband and/or coiled cord.

By monitoring the distortions, or shape of the square wave, the microcontroller 124 may determine whether a monitored circuit (e.g., the ground path of the operator) is complete (e.g., whether the operator is in the circuit and the total equivalent DC resistance is within specifications). If it is determined that the circuit is complete, a visual alarm may indicate pass (by turning a particular color, for example, green). Conversely, if it is determined that the circuit is incomplete (indicating that the operator is not properly grounded), the visual alarm may indicate fail (by turning a different color, for example, red) and an audible alarm may sound. An operator may not be properly grounded for various reasons, such as, for example, if the operator unintentionally disconnects from the device 116 or the wrist strap connection points are intermittent.

Responsive to detection of an operator event, microcontroller 124 may activate a pass or fail visual alarm so long as park sensor 130 has not sent a notification to microcontroller 124 indicating that park interface 140 has been activated.

Park sensor 130 may detect a condition in which park interface 140 has been activated by either an operator's touch or a connection to the personal grounding element 114 (e.g., if the second connector element of the wrist strap is connected to the parking interface 140) and sends an activation notification to the microcontroller 124. Upon receipt of the notification, microcontroller 124 may disable activation of the visual alarm and audible alarm. In some embodiments, upon receiving a park activation notification from park sensor 130, microcontroller 124 may activate a visual alarm indicating a parking status while still disabling the audible alarm.

In some embodiments, the microcontroller 124 may detect a work surface mat event (e.g., if work surface mat 112 is not properly grounded). In this case, microcontroller 124 may continuously monitor a ground path integrity of work surface mat 112 using sensor 128. Work surface mat sensor 128 may detect whether a resistance in a work surface may is less than a predetermined value (e.g., 500 megohms) or outside of a predetermined range. If device 116 is connected to work surface mat 112, the amount of current that flows is a function of the total resistance between device 116 and through work surface mat 112 to ground. If a resistance of work surface mat 112 is below a predetermined threshold or range, the visual alarm may indicate pass (by turning a particular color, for example, green). Conversely, if the resistance level exceeds a predetermined threshold or is outside of a predetermined range (indicating that the work surface may is not properly grounded), a visual alarm may indicate fail (by turning a different color, for example, red) and an audible alarm may sound. Work surface mat 112 may not be properly grounded for various reasons, such as, for example, a disruption in a connection of work surface mat 112 to ground. Work surface mat sensor 128 may send a notification to microcontroller 124 indicating whether a measured resistance level exceeds a predetermined threshold or is outside of a predetermined range.

In some embodiments, microcontroller 124 may detect a tool/equipment event (e.g., if the tool/equipment is not properly grounded).

As noted above, if microcontroller 124 detects an event, microcontroller 124 may activate a visual alarm (i.e., illuminate enclosure 117) by activating (i.e., by sending an activation signal) one or more RGB LEDs 134 and an audible alarm by activating (i.e., by sending an activation signal) sound section 138. In some embodiments, the microcontroller will only activate a visual alarm (e.g., if an operator and/or a work surface mat is properly grounded, or when a personal grounding element is parked).

RGB LEDs 134 are configured to emit a light signal responsive to a signal (i.e., activation signal) from microcontroller 124. In a particular implementation, RGB LEDs 134 may be configured as electric circuit 434 shown in FIG. 4C, for example. Sound section 138 may receive a sound activation signal from microcontroller 124 which causes a buzzer to generate a sound. In some embodiments, sound section 138 may include an audio amplifier coupled to the controller and disposed within the translucent housing, and a speaker connected to the audio amplifier and mounted to an exterior of the translucent housing. Such an audio amplifier may be configured to generate an audible sound through the speaker responsive to an activation signal from microcontroller 124, for example. Sound section 138 may be configured as electric circuit 438 shown FIG. 4D, for example.

Microcontroller 124 may be programmed to activate one or more of the RGB LEDs 134 depending on a particular detected event. So, for example, microcontroller 124 may be programmed to activate green LEDs if the operator is properly grounded (i.e., an operator detected event) and activate the red LEDs and the audible alarm if the operator is not grounded properly (i.e., another operator detected event). Likewise, the microcontroller may be programmed to activate green LEDs if work surface mat 112 is properly grounded (i.e., a work surface mat detected event) and activate the red LEDs and the audible alarm if work surface mat 112 is not grounded properly (e.g., another work surface mat detected event). In some embodiments, microcontroller 124 may be programmed to activate the blue LEDs if park interface 140 has been activated (e.g., a park detected event).

In some embodiments, microcontroller 124 may be programmed to activate a visual alarm for an operator detected event only, a work surface mat detected event only, a parking event only, all of the events, or any combination of the three events. If microcontroller 124 is programmed to activate a visual alarm for more than one type of event, microcontroller 124 may be programmed with a priority process for displaying visual alarms for the different types of events (i.e., operator, work surface mat, park). Moreover, since a visual alarm may be displayed via the enclosure itself, a status display may be used to aid an operator in distinguishing to which event the visual alarm corresponds if the microcontroller 124 is programmed to activate a visual alarm for both an operator detected event and a work surface mat event.

In some embodiments, device 116 may include an enclosure cover 253, referring to FIG. 2A, having an operator status display 271 and a work surface mat status display 273. In a particular implementation, operator and work surface mat status displays may be configured as electric circuit 471 shown in FIG. 4D, for example. Operator status display 271 may display a red or green light corresponding to the visual alarm if device 116 is programmed to provide a visual alarm for the operator only, for example. Work surface mat status display 273 may display a red or green light corresponding to visual alarm if device 116 is programmed to provide a visual alarm for a work surface only. If device 116 is programmed to provide a visual alarm for both, enclosure 117 may illuminate green if both the operator and work surface mat 112 are properly grounded and may illuminate red if both the operator and the work surface mat 112 are not properly grounded or if either of the operator or work surface mat 112 is not properly grounded.

Further, if device 116 is programmed to provide a visual alarm for both an operator and work surface mat 112, operator status display 271 may correspond to a status of the operator independent from a visual alarm, and work surface mat status display 273 may correspond to a status of work surface mat 112 independently from the visual alarm. Although, status displays may correspond to the status of the operator/work surface mat independent from the visual alarm, both the visual alarm and either status display may still look similar.

Microcontroller 124 may be programmed to prioritize display of a visual alarm for either an operator not properly grounded event or a work surface mat not properly grounded event over all other events. So, if the operator is properly grounded and the work surface mat is not properly grounded, then the operator status display will display a green light, work surface mat status display 273 may display a red light and the visual alarm (i.e., the enclosure) will illuminate red. Likewise, if the operator is not properly grounded and the work surface mat is properly grounded, then the operator status display will display a red light, the work surface mat status display will display a green light and the visual alarm will illuminate red.

Figure 5:
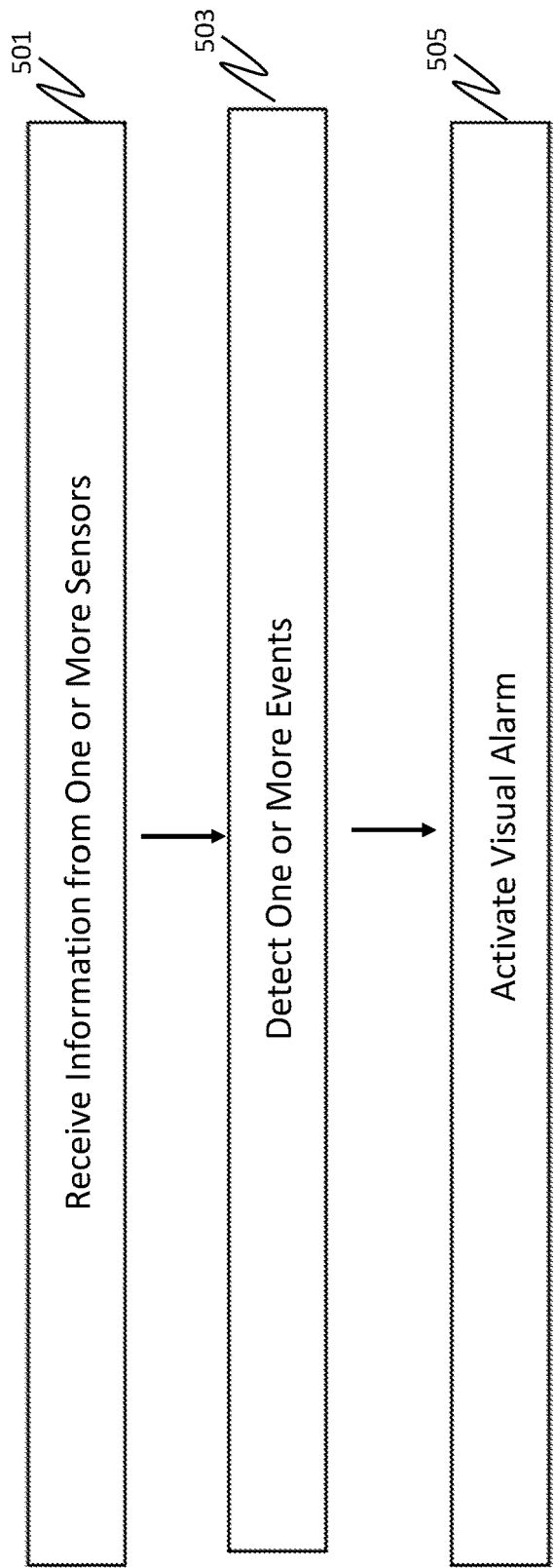
FIG. 5 is an exemplary flow diagram of a control process for operating the continuous monitor according to an embodiment.

Turning to FIG. 5, an exemplary flow diagram illustrating a process 500 of controlling the continuous monitor is shown. At operation 501, microcontroller 124 may receive signals from one or more sensors (e.g., personal grounding element sensor 126, work surface mat sensor 128 and/or park sensor 130). At operation 503, microcontroller 124 may detect one or more events (e.g., a disruption in a connection of an operator to a ground, a disruption in a connection of work surface mat 112 to a ground and/or detection of personal grounding element 114 attached to park interface 140), based, at least in part, on signals received from the one or more sensors. In response to detecting one or more events, microcontroller 124 may activate a visual alarm, at operation 505, by activating a light signal which may power one or more lighting elements to illuminate the translucent housing (i.e., enclosure 117) in a manner consistent with preprogrammed settings. Illumination of the translucent housing may provide visual alarm signals as an observable (e.g., observable by an operator) indication of one or more detected events.

In detecting one or more events, microcontroller 124 may continuously monitor a ground path integrity of work surface mat 112 using work surface sensor 128 and a ground path integrity of a personal grounding element 114 using personal grounding element sensor 126. Microcontroller 124 may continuously monitor park sensor to detect a park event.

In an embodiment, microcontroller may be programmed to illuminate enclosure 117 responsive to detection of any one of multiple events (e.g., events identified above). In an implementation, among the multiple events, microcontroller 124 may prioritize illumination of enclosure 117 for a particular detected event. To aid an observer in distinguishing to which one of a plurality of detected events the visual alarm represents, microcontroller 124 may activate a status display.

Microcontroller 124 may activate an audio amplifier to generate an audible sound through a speaker responsive to detecting one or more events.

As used herein, the term "and/or" includes any and all combinations of one or more of the associated listed items. Further, the singular forms of the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence of addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electrostatic discharge (ESD) continuous monitor comprising:
    a printed circuit board to comprise a signal control circuit;
    one or more sensors coupled to the signal control circuit;
    one or more light emitting devices to emit a light signal responsive to a signal from the signal control circuit; and
    a translucent housing, wherein:
    the printed circuit board and the one or more light emitting devices are disposed within the translucent housing;
    the signal control circuit detects an event using information received from the one or more sensors;
    the light signal to visibly illuminate the translucent housing responsive to an event detected by the signal control circuit;
    the translucent housing comprises a circular shape in at least one dimension to spread light from the light signal in a circular pattern;
    the one or more light emitting devices to emit a first visual signal responsive to detection of a ground condition of a first device; and
    the one or more light emitting devices to emit a second visual signal, the second visual signal to be visually distinct from the first visual signal, responsive to detection of a ground condition of a second device, the second device to be distinct from the first device.

2. The ESD continuous monitor of claim 1, wherein:
    the one or more sensors include a personal grounding element sensor for sensing an output from a personal grounding element, a work surface mat sensor for sensing a resistance level of a work surface mat, and a park sensor for sensing an input at a snap plug.

3. The ESD continuous monitor of claim 1, and further comprising:
    an audio amplifier coupled to the signal control circuit and disposed within the translucent housing; and
    a speaker connected to the audio amplifier and mounted to an exterior of the translucent housing, wherein:
    the audio amplifier generates an audible sound through the speaker responsive to the event.

4. The ESD continuous monitor of claim 2, wherein:
    the continuous monitor is adapted to be mounted to the work surface mat such that the printed circuit board is in electrical contact with the work surface mat; and
    the event comprises a disruption in a connection of the work surface mat to a ground.

5. The ESD continuous monitor of claim 4, wherein:
    the continuous monitor further comprises threaded fasteners conductively mounted to the printed circuit board; and
    the threaded fasteners are adapted to receive screws to fasten the continuous monitor to the work surface mat to form a conductive connection between the work surface mat and the printed circuit board.

6. The ESD continuous monitor of claim 1, wherein:
    the continuous monitor comprises a jack to receive a cord to attached to an operator; and
    the event comprises a disruption in a connection of the operator to a ground.

7. The ESD continuous monitor of claim 3, wherein:
the continuous monitor comprises a snap plug to receive a cord attached to a personal grounding element; and
the event comprises detection of the cord attached to the snap plug.

8. The ESD continuous monitor of claim 1, and further comprising:
a light diffuser integrated in the translucent housing; and
the light diffuser is configured to evenly diffuse the light signal emitted by the one or more light emitting devices.

9. The ESD continuous monitor of claim 6, wherein:
the signal control circuit comprises a wave distortion ADC filter and a wave distortion processing module; and
the signal control circuit utilizes the wave distortion ADC filter and wave distortion processing module to detect the event.

10. The ESD continuous monitor of claim 1, wherein:
the signal control circuit is programmed to illuminate the translucent housing when an event is detected for an operator, a work surface mat or both; and
the signal control circuit is programmed to prioritize between an operator detected event and a
work surface mat detected event when the signal control circuit is programmed to illuminate the translucent housing for both.

11. A method of controlling an electrostatic discharge (ESD) continuous monitor including a signal control circuit, the method
comprising:
obtaining, by the signal control circuit, one or more signals received from one or more sensors;
detecting, by the signal control circuit, one or more events based, at least in part, on the one or more signals received from the one or more sensors; and
activating, by the signal control circuit, a light signal to illuminate a translucent housing of the
ESD continuous monitor in response to detecting the one or more events;
wherein:
an illumination of the translucent housing is to express a visual alarm signaling the one or more detected events;
the translucent housing comprises a circular shape in at least one dimension to spread light from the light signal in a circular pattern;
the light signal comprises a first visual signal responsive to detection of a ground condition of a first device; and
the light signal comprises a second visual signal, the second visual signal to be visually distinct from the first visual signal, responsive to detection of a ground condition of a second device, the second device to be distinct from the first device.

12. The method of claim 11, wherein:
the one or more events comprise a disruption in a connection of an operator to a ground.

13. The method of claim 11, wherein:
the one or more events comprise a disruption in a connection of a work surface mat to a ground.

14. The method of claim 11, wherein:
the one or more events comprise detection of a cord attached to a snap plug.

15. The method of claim 11, wherein:
the signal control circuit is programmed to illuminate the translucent housing responsive to detection of any one of a plurality of events; and
the method further comprises:
prioritizing, by the signal control circuit, an event to display via the translucent housing.

16. The method of claim 15, wherein:
the signal control circuit is programmed to illuminate the translucent housing responsive to detection of any one of a plurality of events; and
the method further comprises:
activating, by the signal control circuit, a status display to visibly distinguish among occurrences the plurality of events.

17. The method of claim 11, wherein:
the one or more sensors include a personal grounding element sensor for sensing an output signal from a personal grounding element, a work surface mat sensor for sensing a resistance level of a work surface mat or a park sensor for sensing an input at a snap plug, or a combination thereof.

18. The method of claim 17, and further comprising:
continuously monitoring, by the signal control circuit, a ground path integrity of a work surface mat based, at least in part, on a signal generated by the work surface mat sensor.

19. The method of claim 17, and further comprising:
continuously monitoring, by the signal control circuit, a ground path integrity of an operator based, at least in part, on a signal generated by the personal grounding element sensor.

20. The method of claim 11, and further comprising:
activating, by the signal control circuit, an audio amplifier to generate an audible sound through a speaker responsive to detecting at least one of the one or more events.

* * * * *